US010818867B2

(12) United States Patent
Zou

(10) Patent No.: US 10,818,867 B2
(45) Date of Patent: Oct. 27, 2020

(54) OLED ILLUMINATION PANEL, METHOD FOR DRIVING THE SAME, AND ILLUMINATION DEVICE

(71) Applicant: BOE Technology Group Co., Ltd., Beijing (CN)

(72) Inventor: Xiangxiang Zou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/170,295

(22) Filed: Oct. 25, 2018

(65) Prior Publication Data

US 2019/0207147 A1 Jul. 4, 2019

(30) Foreign Application Priority Data

Jan. 4, 2018 (CN) .......................... 2018 1 0007396

(51) Int. Cl.
*H01L 51/52* (2006.01)
*H01L 27/32* (2006.01)
(Continued)

(52) U.S. Cl.
CPC ...... *H01L 51/5209* (2013.01); *H01L 27/3204* (2013.01); *H01L 27/3288* (2013.01); *H01L 51/5221* (2013.01); *H05B 45/60* (2020.01); *H05B 47/105* (2020.01); *F21S 6/002* (2013.01); *F21Y 2105/16* (2016.08); *F21Y 2115/15* (2016.08); *H01L 27/3202* (2013.01); *H01L 27/323* (2013.01); *H01L 2251/5361* (2013.01); *Y02B 20/36* (2013.01)

(58) Field of Classification Search
None
See application file for complete search history.

(56) References Cited

U.S. PATENT DOCUMENTS 8,957,411 B2 * 2/2015 Yamazaki ............. H01L 29/247
257/40
9,401,390 B2 * 7/2016 Song ................... H01L 27/3248
(Continued)

FOREIGN PATENT DOCUMENTS

| CN | 103000639 A | 3/2013 |
|----|-------------|--------|
| CN | 103715202 A | 4/2014 |
| CN | 105393381 A | 3/2016 |

OTHER PUBLICATIONS

Chinese Office Action for corresponding application 201810007396.0 dated Dec. 24, 2019.

*Primary Examiner* — Amy Cohen Johnson
*Assistant Examiner* — Srinivas Sathiraju
(74) *Attorney, Agent, or Firm* — Arent Fox LLP; Michael Fainberg

(57) ABSTRACT

Disclosed are an OLED illumination panel, a method for driving the same, and an illumination device. In an embodiment of the disclosure, an anode of an organic light-emitting diode of the OLED illumination panel is segmented into several electrode sections, all the block electrodes are electrically connected in each electrode section through an electrical conductor, and the electrode sections are connected with a driver circuit through their respective corresponding electrically-conductive traveling lines, so that all the electrode sections of the OLED illumination panel are separate from each other.

6 Claims, 4 Drawing Sheets

(51) Int. Cl.
*H05B 45/00* (2020.01)
*H05B 47/105* (2020.01)
*F21Y 105/16* (2016.01)
*F21S 6/00* (2006.01)
*F21Y 115/15* (2016.01)

(56) References Cited

U.S. PATENT DOCUMENTS

| | | | |
|---|---|---|---|
| 9,431,465 B2* | 8/2016 | Yamazaki | H01L 27/124 |
| 9,574,757 B2* | 2/2017 | Omata | G06F 3/0412 |
| 9,647,049 B2* | 5/2017 | Wu | H01L 27/3211 |
| 9,772,095 B2* | 9/2017 | Omata | F21V 23/0485 |
| 9,842,887 B2* | 12/2017 | Sato | H01L 27/3276 |
| 10,064,252 B2* | 8/2018 | Tada | H01L 51/5246 |
| 10,103,356 B2* | 10/2018 | Ma | H01L 27/3246 |
| 10,128,318 B2* | 11/2018 | Sato | H01L 51/5012 |
| 10,381,603 B2* | 8/2019 | Xu | H01L 51/0031 |
| 2005/0180083 A1* | 8/2005 | Takahara | G09G 3/006 361/152 |
| 2014/0159022 A1 | 6/2014 | Song et al. | |
| 2016/0005766 A1 | 1/2016 | Choi et al. | |
| 2016/0143112 A1 | 5/2016 | Jacobs et al. | |
| 2016/0276629 A1* | 9/2016 | Ma | H01L 27/3246 |
| 2017/0280531 A1* | 9/2017 | Tada | H01L 27/3206 |
| 2018/0018052 A1* | 1/2018 | Yang | H01L 51/5221 |
| 2018/0069056 A1* | 3/2018 | Sato | H01L 27/3276 |
| 2018/0224996 A1* | 8/2018 | Rad | G06F 3/046 |
| 2018/0233705 A1* | 8/2018 | Xu | H01L 51/56 |
| 2019/0043933 A1* | 2/2019 | Sato | H01L 27/3276 |
| 2019/0103060 A1* | 4/2019 | Kang | G09G 3/3233 |
| 2019/0271874 A1* | 9/2019 | Fu | H01L 27/323 |
| 2020/0007123 A1* | 1/2020 | Guo | H03K 17/6871 |

* cited by examiner

OLED ILLUMINATION PANEL, METHOD FOR DRIVING THE SAME, AND ILLUMINATION DEVICE

CROSS-REFERENCE TO RELATED APPLICATION

This application claims priority of Chinese Patent Application No. 201810007396.0, filed on Jan. 4, 2018, which is hereby incorporated by reference in its entirety.

FIELD

The present disclosure relates to the field of illumination devices, and particularly to an OLED illumination panel, a method for driving the same, and an illumination device.

BACKGROUND

An OLED stands for an Organic Light-Emitting Diode, also referred to as an organic electro-laser display element or an organic light-emitting semiconductor. The OLED is an element made of an organic semiconductor material. Generally the material of the OLED is consisted of small or macro molecules, and typically an organic material of small molecules in the industry. Since the OLED made of the material of small molecules includes a substrate made of cheap glass, and is fabricated in a process of forming a film through thermal evaporation and plating in vacuum in a large area, the OLED is an inherent planar light source.

The OLED has a number of advantages when it is applied to an illumination panel, where general advantages of the OLED include uniform and moderate light emission, the highest similarity to natural light, no hurt arising from blue light, no flickering, no UV rays, etc., so human eyes will not be hurt.

SUMMARY

An embodiment of the disclosure provides an OLED illumination panel including an base substrate, an organic light-emitting diode on the base substrate, and a drive circuit, wherein the organic light-emitting diode includes an anode, a cathode, and a light-emitting layer between the anode and the cathode, wherein:
the anode includes a plurality of electrode sections distributed in an array, and each of the electrode sections includes at least one block electrode;
electrically-conductive traveling lines corresponding to the electrode sections in a one-to-one manner are on the base substrate, and in each pair of an electrically-conductive traveling line and an electrode section corresponding to each other, the electrically-conductive traveling line is electrically connected with each block electrode in the electrode section; and
the driver circuit is electrically connected with the electrically-conductive traveling lines, and configured to transmit at least one of an illumination driver signal and a touch diver signal to the electrode sections under.

Optionally, in each pair of an electrode section and an electrically-conductive traveling line corresponding to each other, the electrode section includes a plurality of block electrodes distributed in an array, the respective block electrodes are electrically connected with each other through the electrical conductor, and the electrically-conductive traveling line is electrically connected with the electrical conductor.

Optionally, in the organic light-emitting diode, the anode is on a side of the cathode facing the base substrate, and the electrically-conductive traveling lines are on a side of the anode facing the base substrate.

Optionally, the electrical conductors are at a layer same as a layer at which the electrically-conductive traveling lines are.

Optionally, the plurality of electrode sections include at least one first electrode section and at least one second electrode section, wherein the electrically-conductive traveling line corresponding to each of the first electrode sections passes through a gap between block electrodes in the at least one second electrode section;
the electrical conductor of the second electrode section further includes bridges for bridging the electrically-conductive traveling line corresponding to the first electrode section.

Optionally, the bridges are at a layer same as a layer at which the block electrodes are.

Optionally, the plurality of electrode sections include at least one first electrode section and at least one second electrode section, wherein the electrically-conductive traveling line corresponding to each of the first electrode sections passes through a gap between block electrodes in the at least one second electrode section;
the electrically-conductive traveling line corresponding to the first electrode section includes bridges for bridging the electrical conductor of the second electrode section.

Optionally, the bridges are at a layer same as a layer at which the block electrodes are.

Optionally, the electrical conductors are at a layer different from a layer at which the electrically-conductive traveling lines are, wherein an insulation layer is between the electrical conductors and the electrically-conductive traveling lines, and the block electrodes in the electrode section of the anode are electrically connected with corresponding electrical conductors through through-holes.

An embodiment of the disclosure provides a method for driving an OLED illumination panel by providing the OLED illumination panel above with a driver signal, the method including:
providing an illumination driver signal and a touch driver signal to the electrode sections under a transmission method, wherein the transmission method includes: in a touch detection stage, providing a touch scan signal to the respective electrode sections, and in an illumination stage, providing an illumination driver signal to the respective electrode sections; or providing an illumination driver signal to a part of the electrode sections, and providing a touch drive signal to the other part of the electrode sections;
obtaining, by the electrode sections, a touch action signal upon being provided with a touch driver signal; and
controlling an illumination attribute of the illumination panel according to the obtained touch action signal.

Optionally, the touch action includes at least one of clicking and sliding, and the illumination attribute includes at least one of an on-off state, color temperature, or brightness.

An embodiment of the disclosure further provides an illumination device including a lamp stand, and the illumination panel above installed on the lamp stand.

BRIEF DESCRIPTION OF THE DRAWINGS

In order to make the technical solutions according to the embodiments of the disclosure more apparent, the drawings to which reference will be made in a description of the embodiments will be introduced below in brief, and apparently the drawings to be described below illustrate only a part but not all of the embodiments of the disclosure, and those ordinarily skilled in the art can further derive from these drawings other drawings without any inventive effort.

DETAILED DESCRIPTION OF THE EMBODIMENTS

In order to make the objects, technical solutions, and advantages of the disclosure more apparent, the disclosure will be described below in further details with reference to the drawings, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

In the existing OLED illumination panel, it is common to control the OLED illumination panel to be switched on or off, and to adjust color temperature and other characteristics thereof, by pressing a button or rotating a knob, so the OLED illumination panel cannot be manipulated flexibly and conveniently in the related art.

Figure 2:
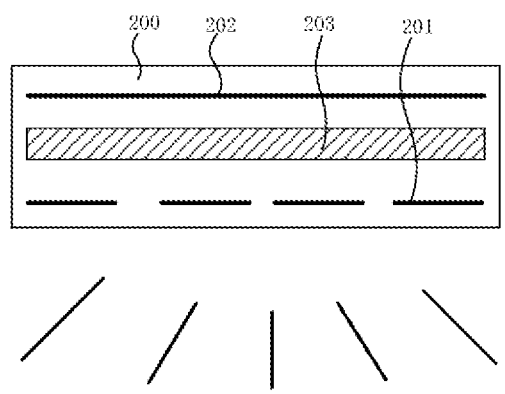
FIG. 2 is a schematic diagram of a general structure of a light-emitting diode in the OLED illumination device according to the embodiment of the disclosure.
Figure 3:
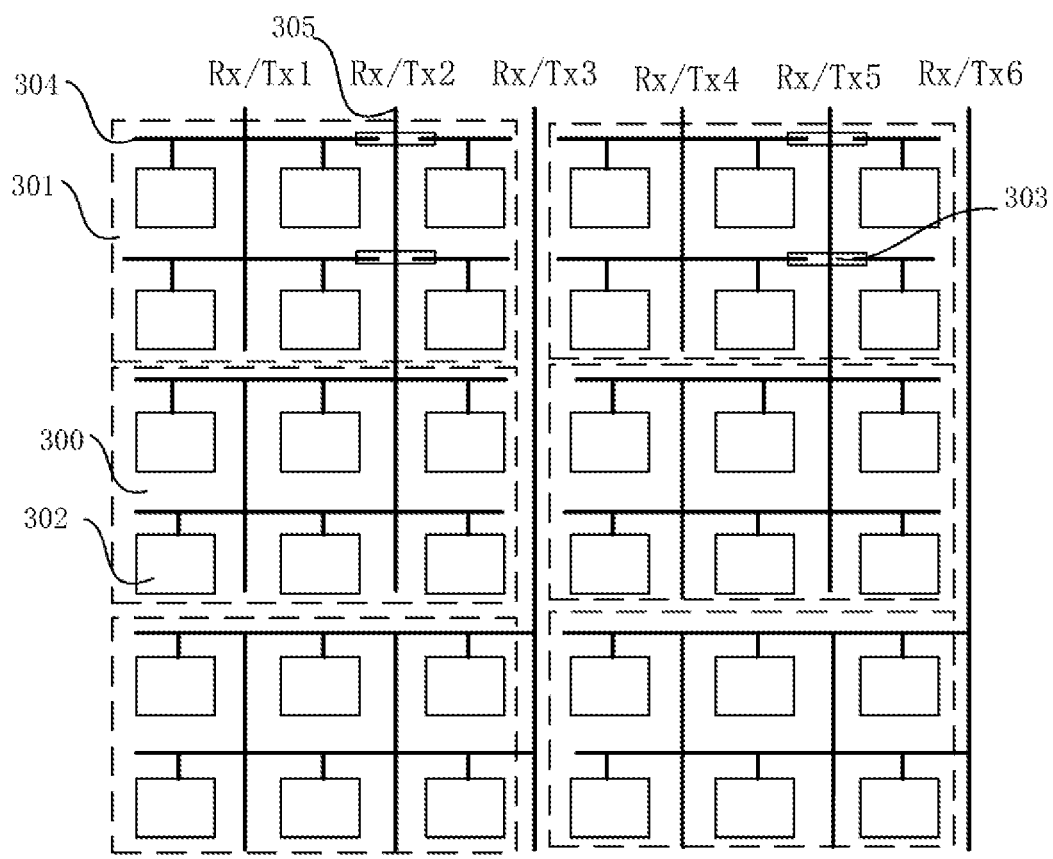
FIG. 3 is a schematic structural diagram of a first anode segment according to an embodiment of the disclosure.

As illustrated in FIG. 2 and FIG. 3, an embodiment of the disclosure provides an OLED illumination panel including an base substrate, an organic light-emitting diode 200 formed on the base substrate, and a drive circuit, where the organic light-emitting diode 200 includes an anode 201, a cathode 202, and a light-emitting layer 203 located between the anode 201 and the cathode 202.

The anode 201 includes a plurality of electrode sections 300 distributed in an array, and each of the electrode sections 300 includes at least one block electrode 302.

Electrically-conductive traveling lines 305 corresponding to the electrode sections 300 in a one-to-one manner are formed on the base substrate, and of each pair of an electrically-conductive traveling line 305 and an electrode section 300 corresponding to each other, the electrically-conductive traveling line 305 is electrically connected with each block electrode 302 in the electrode section 300.

The driver circuit is electrically connected with the electrically-conductive traveling lines 305, and configured to transmit at least one of an illumination driver signal or a touch diver signal to the electrode sections 300.

In the embodiment of the disclosure, the OLED illumination panel is fabricated in such a way that the anode 201 of the organic light-emitting diode 200 of the OLED illumination panel is segmented into several electrode sections 300, each electrode section 300 includes at least one block electrode 302, all the block electrodes 302 are electrically connected in the electrode section 300 through an electrical conductor 304, and the electrode sections 300 are connected with the driver circuit through their respective corresponding electrically-conductive traveling lines 305, so that all the electrode sections 300 of the OLED illumination panel are separate anode segments which can provide an illumination function after an illumination driver signal is applied thereto, and perform a touch detection function after a touch driver signal is applied thereto. In this way, the OLED illumination panel can be controlled to be switched on or off, and color temperature and other characteristics thereof can be adjusted, according to a detected touch action so that the OLED illumination panel can be manipulated more flexibly and conveniently.

Figure 1:
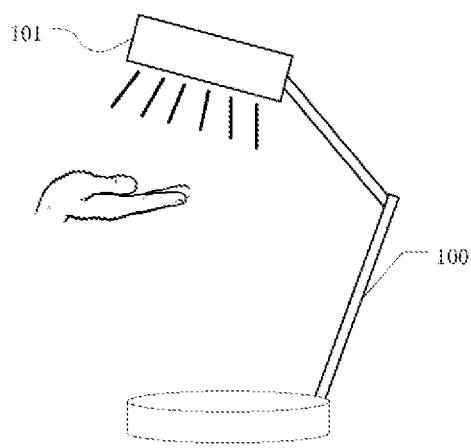
FIG. 1 is a schematic diagram of a general structure of an OLED illumination device according to an embodiment of the disclosure.

Here the OLED illumination panel can be arranged on a lamp stand 100 as illustrated in FIG. 1 to thereby be positioned stably, so that the OLED illumination panel can provide a good illumination function. In addition, a device for fixing the OLED illumination panel can be embodied in a number of forms, but will not be limited to the device as illustrated in FIG. 1; and a corresponding device can be made as needed in particular in a particular application.

Here the block electrode can be transparent.

Optionally, each pair of an electrode section 300 and an electrically-conductive traveling line 305 corresponding to each other, the electrode section 300 includes a plurality of block electrodes 302 distributed in an array, the respective block electrodes 302 are electrically connected with each other through the electrical conductor 304, and the electrically-conductive traveling line 305 is electrically connected with the electrical conductor 304.

When each of the several electrode sections 300 distributed in an array in the anode 201 of the OLED illumination panel include two or more block electrodes 302, the electrical conductor 304 for connecting the block electrodes 302 in the electrode section 300 is formed on the base substrate, and the block electrodes 302 in the electrode section 300 are connected into one through the electrical conductor 304, where there are the same number of block electrodes 302 in each electrode section 300.

After all the block electrodes 302 in the same electrode section 300 are electrically connected into one through the electrical conductor 304, the electrically-conductive traveling lines 305 corresponding to the electrode sections 300 in a one-to-one manner are further formed on the base substrate, and of each pair of an electrode section 300 and an electrically-conductive traveling line 305 corresponding to each other, the electrically-conductive traveling line 305 is electrically connected with the electrical conductor 304 of the corresponding electrode section 300 to thereby form a signal wire of the electrode section 300; and after the electrically-conductive traveling line 305 is connected with the driver circuit, the electrode section can be provided with a corresponding driver signal through the electrically-conductive traveling line 305 to thereby perform an illumination or touch function.

Optionally, in the organic light-emitting diode 200, the anode 201 is located on the side of the cathode 202 facing the base substrate, and the electrically-conductive traveling lines 305 are located on the side of the anode 201 facing the base substrate.

In the organic light-emitting diode OLED 200, the anode 201 is located on the side of the cathode facing the base substrate, and a light-emitting layer 203 is arranged between the anode 201 and the cathode 202, and the electrically-conductive traveling lines 305 corresponding to the several electrode sections 300, into which the anode 201 is segmented, in a one-to-one manner are located on the side of the anode 201 facing the base substrate to provide a driver signal.

The organic light-emitting diode OLED 200 can be fabricated as follows to thereby dispense with a process, and reduce the thickness of the OLED illumination panel.

Optionally, the electrical conductors 304 are arranged at the same layer as the electrically-conductive traveling lines 305.

When the electrical conductors 304 connecting the block electrodes 302 in the electrode sections 300 are arranged at the same layer as the electrically-conductive traveling lines 305 corresponding to the block electrodes 302 in a one-to-one manner, the electrical conductors 304 partially intersect and overlap with the electrically-conductive traveling lines 305, and in order to separate the electrode sections 300 in the anode 201 from each other, the electrical conductors 304 or the electrically-conductive traveling lines 305 are bridged using bridges 303.

In a first implementation, components of the electrical conductors are connected across the electrically-conductive traveling lines using the bridges.

Optionally, the plurality of electrode sections include at least one first electrode section and at least one second electrode section, where the electrically-conductive traveling line corresponding to each of the first electrode sections passes through a gap between block electrodes in the at least one second electrode section, where in the second electrode section through which each of the first electrode sections passes, the electrical conductor of the second electrode section further includes bridges for bridging the electrically-conductive traveling line corresponding to the first electrode section.

As illustrated in FIG. 3, the anode is segmented into several block electrodes 302, every six block electrodes 302 constitute an electrode section, each electrode section is surrounded by a dotted box, the electrically-conductive traveling line 305 connected with the first electrode section 300 is Rx/Tx2, and the electrically-conductive traveling line 305 connected with the second electrode section 301 is Rx/Tx1; and when the electrically-conductive traveling line 305, Rx/Tx2, connected with the first electrode section 300 passes through a gap between two block electrodes 302 in the second electrode section 301, it partially intersects and overlaps with the electrical conductor 304 connecting the block electrodes 302 in the second electrode section 301, and at this time, the components of the electrical conductor 304 of the second electrode section 301 are connected across the electrically-conductive traveling line 305 of the first electrode section 300 using the bridges 304, so that several electrode sections constituting a transparent electrode can be separated from each other instead of being electrically connected with each other.

Optionally, the bridges 303 are arranged at the same layer as the block electrodes 302.

In order to simplify a process of fabricating the organic light-emitting diode OLED, and to reduce the thickness of the OLED illumination panel, the bridges can be made of the same material as the block electrodes, so the bridges can be arranged at the same layer as the block electrodes, and fabricated at the same time as the block electrodes.

Figure 5:
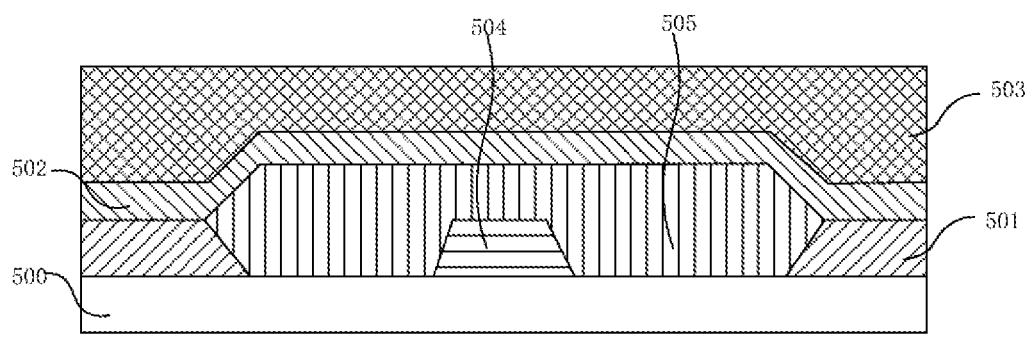
FIG. 5 is a schematic structural diagram of a bridge corresponding to a first anode segmenting method according to an embodiment of the disclosure.

Here a bridge is structured as illustrated in FIG. 5, where an electrical conductor 501 and an electrically-conductive traveling line 504 are arranged on an base substrate 500, an insulation layer 505 is arranged between the electrical conductor 501 and the electrically-conductive traveling line 504, a bridge 502 is arranged on the insulation layer 505, the bridge 502 is connected with the electrical conductor 501, and a light-emitting layer 503 is located on the bridge 502.

In a second implementation, components of the electrically-conductive traveling lines are connected across the electrical conductors using the bridges.

Optionally, the plurality of electrode sections include at least one first electrode section and at least one second electrode section, where the electrically-conductive traveling line corresponding to each of the first electrode sections passes through a gap between block electrodes in the at least one second electrode section, where in each of the first electrode sections, the electrically-conductive traveling line corresponding to the first electrode section includes bridges for bridging the electrical conductor of the second electrode section.

Figure 4:
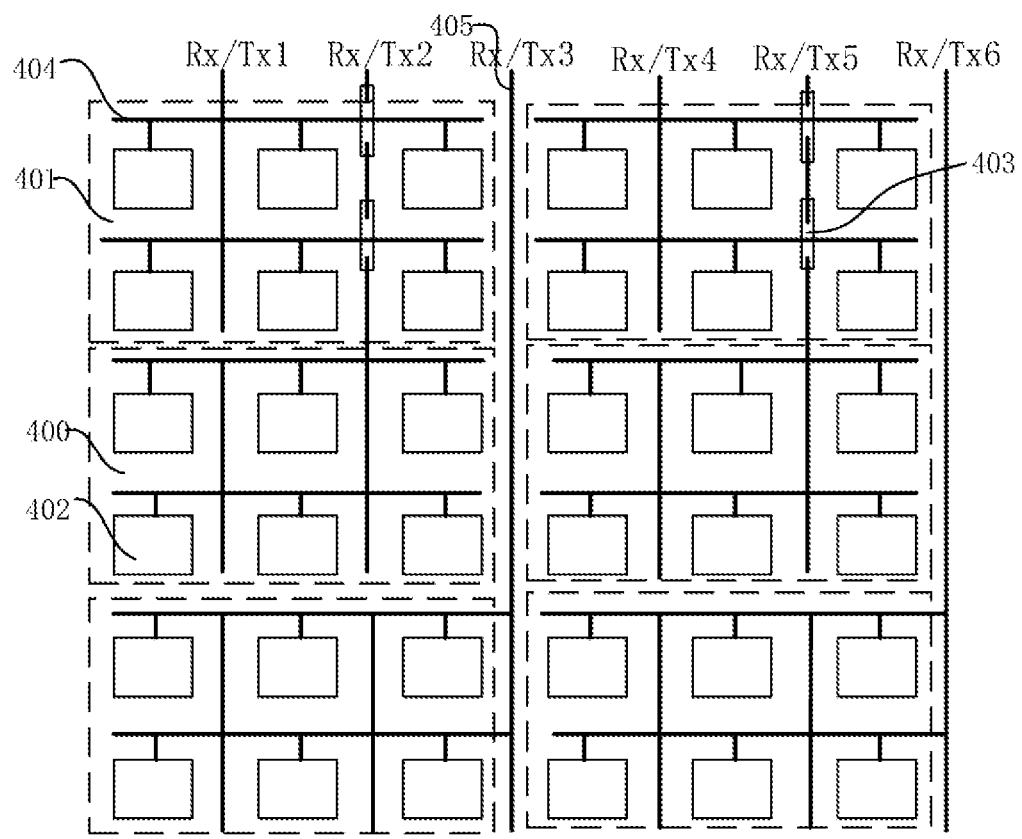
FIG. 4 is a schematic structural diagram of a second anode segment according to an embodiment of the disclosure.

As illustrated in FIG. 4, the anode is segmented into several block electrodes 402, every six block electrodes 402 constitute an electrode section, each electrode section is surrounded by a dotted box, the electrically-conductive traveling line 405 connected with the first electrode section 400 is Rx/Tx2, and the electrically-conductive traveling line 405 connected with the second electrode section 401 is Rx/Tx1; and when the electrically-conductive traveling line Rx/Tx2, connected with the first electrode section 400 passes through a gap between two block electrodes 402 in the second electrode section 401, it partially intersects and overlaps with the electrical conductor 404 connecting the block electrodes 402 in the second electrode section 401, and at this time, the components of the electrically-conductive traveling line 405 of the first electrode section 400 are connected across the electrical conductor 404 of the second electrode section 401 using the bridges 403, so that several electrode sections constituting a transparent electrode can be separated from each other instead of being electrically connected with each other.

Optionally, the bridges are arranged at the same layer as the block electrodes.

In order to simplify a process of fabricating the organic light-emitting diode OLED, and to reduce the thickness of the OLED illumination panel, the bridges can be made of the same material as the block electrodes, so the bridges can be arranged at the same layer as the block electrodes, and fabricated at the same time as the block electrodes.

Figure 6:
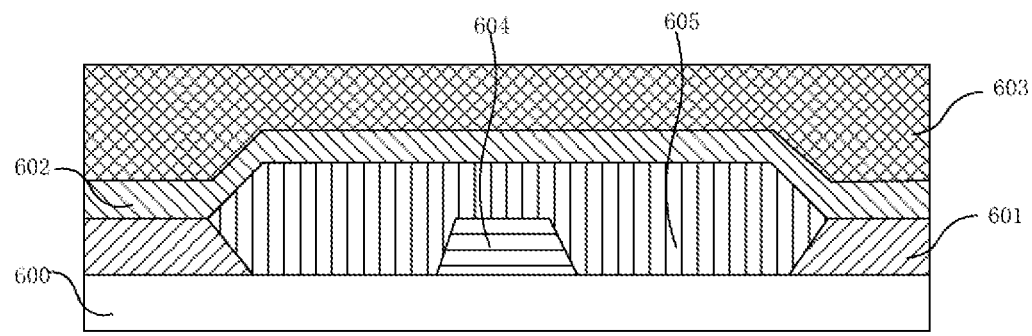
FIG. 6 is a schematic structural diagram of a bridge corresponding to a second anode segmenting method according to an embodiment of the disclosure.

Here a bridge is structured as illustrated in FIG. 6, where an electrically-conductive traveling line 601 and an electrical conductor 604 are arranged on an base substrate 600, an insulation layer 605 is arranged between the electrically-conductive traveling line 601 and the electrical conductor 604, a bridge 602 is arranged on the insulation layer 605, the bridge 602 is connected with the electrical conductor 601, and a light-emitting layer 603 is located on the bridge 602.

When the components of the electrical conductors or the electrically-conductive traveling lines for electrical connection are connected using the bridges, the electrical conductors can alternatively be arranged at a different layer from the electrically-conductive traveling lines.

Optionally, the electrical conductors are arranged at a different layer from the electrically-conductive traveling lines, where an insulation layer is arranged between the electrical conductors and the electrically-conductive traveling lines, and the block electrodes in the electrode section of the anode are electrically connected with their corresponding electrical conductors through through-holes.

Figure 7:
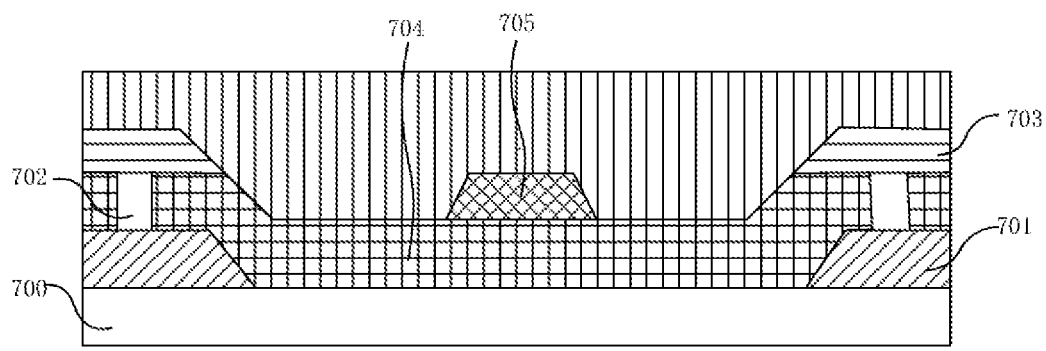
FIG. 7 is a schematic structural diagram of a third anode segment according to an embodiment of the disclosure.

As illustrated in FIG. 7, when the electrical conductors 701 are arranged at a different layer from the electrically-conductive traveling lines 705, firstly the electrical conductors 701 in the electrode sections can be formed on an base substrate 700, then an insulation layer 704 can be arranged thereon, next the electrically-conductive traveling lines 705 corresponding to the electrode sections in an one-to-one manner can be fabricated, and then block electrodes 703 of the anode can be fabricated, and the electrical conductors are electrically connected with the block electrodes in their corresponding electrode sections through through-holes 702. In this way, several electrode sections constituting a transparent electrode can also be separated from each other instead of being electrically connected with each other.

After the OLED illumination panel is fabricated, the embodiment of the disclosure further provides a corresponding method for providing a driver signal so that after the driver circuit is electrically connected with the electrically-conductive traveling lines, an illumination driver signal and/or a touch driver signal can be transmitted to the electrode sections under the preset rule.

An embodiment of the disclosure provides a method for driving an OLED illumination panel by providing the OLED illumination panel above with a driver signal, where the method includes:

providing at least one of an illumination driver signal and a touch driver signal to the electrode sections under a transmission method, where the transmission method includes: in a touch detection stage, a touch scan signal is provided to the respective electrode sections, and in an illumination stage, an illumination driver signal is provided to the respective electrode sections, or an illumination driver signal is provided to a part of the electrode sections, and a touch drive signal is provided to the other part of the electrode sections.

In order to control the OLED illumination panel using a touch function, firstly the OLED illumination panel shall be provided with different driver signals to thereby perform different functions so that it can operate normally.

Optionally, in the touch detection stage, a touch scan signal is provided to the respective electrode sections, and in the illumination stage, driver voltage is provided to the respective electrode sections, or an illumination driver signal is provided to a part of the electrode sections, and a touch driver signal is provided to the other part of the electrode sections.

Here the method can be a time-division driving method and a zone-division driving method.

Figure 8:
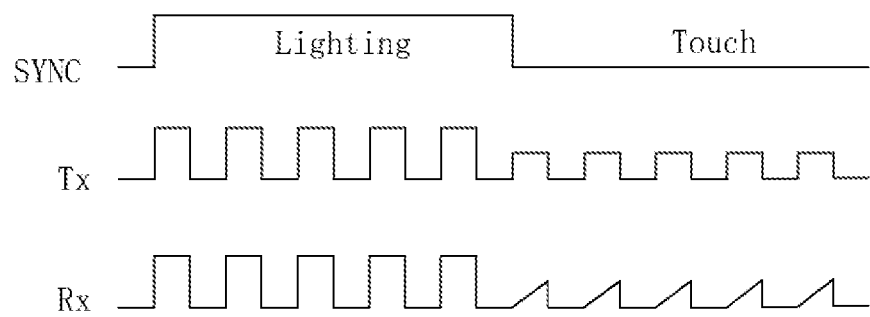
FIG. 8 is a schematic diagram of a time-division driver signal according to an embodiment of the disclosure.

1. Time-Division Driving:

as illustrated in FIG. 8, an embodiment of the disclosure provides a time-division driver signal so that the driver circuit provides a touch scan signal to the respective electrode sections in a touch detection stage; and the driver circuit provides illumination driver voltage to the respective electrode sections in an illumination stage.

When the driver circuit provides illumination driver voltage to the respective electrode sections, the OLED illumination panel provides an illumination function, and when the driver circuit provides touch driver voltage to the respective electrode sections, the OLED illumination panel provides a touch detection function, to obtain the amounts of charges on the respective electrode sections constituting the anode, compare the amounts of charges on the respective electrode sections, and determine the position of the current touch, and an action of the touch, according to a result of comparing the amounts of charges.

2. Zone-Division Driving:

in the zone-division driving mode, the OLED illumination panel provides an illumination driver signal to a part of the electrode sections, and a touch driver signal to the other part of the electrode sections.

Here the driver voltage provided by the OLED illumination panel to the electrode sections can be selected randomly, or can be preset, and there is no definite correlation between the electrode sections receiving an illumination driver signal, and the electrode sections receiving a touch driver signal.

For example, the OLED illumination panel can provide different driver voltage to two adjacent electrode sections, that is, it can provide an illumination driver signal to one of the two different electrode sections, and a touch drive signal to the other electrode section.

When there is a touch action occurring, the OLED illumination panel triggers the touch detection function, and when the driver circuit provides touch driver voltage to the corresponding electrode sections, it obtains the amount of charges on each electrode section, compares the amounts of charges on the respective electrode sections, and determines the position of the current touch, and the action of the touch, according to a result of comparing the amounts of charges.

Optionally, when the electrode sections are provided with a touch driver signal, they obtain a touch action signal.

When the electrode sections obtain a touch action signal, the OLED illumination panel operates in a touch detection state, and at this time, the OLED illumination panel obtains the amounts of charges on the respective electrode sections constituting the anode, compares the amounts of charges on the respective electrode sections, determines the area of the electrode section with the largest amount of charges as the center of a touch, and hereby determines the position of the touch, and an action of the touch.

After the position of the touch, and the action of the touch are determined, the OLED illumination panel is manipulated according to the determined position of the touch, and action of the touch under a preset rule.

Optionally, an illumination attribute of the OLED illumination panel is controlled according to the obtained touch action signal.

For example, in order to perform the touch function of the OLED illumination panel, the OLED illumination panel can be clicked on twice consecutively to enable the illumination function, and three times consecutively to disable the illumination function.

The OLED illumination panel disables the illumination function upon determining that the current touch action is clicking three times consecutively.

In another example, when the touch action is recognized as sliding, color temperature, etc., of the OLED illumination panel can be controlled and adjusted according to the length of time for the sliding action.

When the OLED illumination panel determines that the current touch action is sliding, color temperature of the OLED illumination panel is raised as the sliding action is being prolonged.

Here the touch action includes but will not be limited to clicking and sliding, and the illumination attribute includes but will not be limited to being switched on/off, color temperature, and brightness.

Also the respective characteristics of the OLED illumination panel can be controlled and adjusted as needed in reality upon detecting the position of the touch, and the action of the touch, although the embodiment of the disclosure will not be limited thereto.

With the method above, the OLED illumination panel can be controlled to be switched on or off, and color temperature and other characteristics thereof can be adjusted, according to the detected touch action.

Furthermore, the OLED illumination panel can further perform a fingerprint recognition function when the touch detection function thereof is more powerful as the area of an electrode section in the anode is smaller.

An embodiment of the disclosure further discloses an illumination device as illustrated in FIG. 1, which includes a lamp stand 100, and the illumination panel 101 above installed on the lamp stand 100.

The disclosure has been described above in a flow chart and/or a block diagram of the method, the device (system) and the computer program product according to the embodiments of the disclosure. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

Correspondingly the disclosure can be further embodied in hardware and/or software (including firmware, resident software, micro-codes, etc.). Still furthermore the disclosure can be embodied in the form of a computer program product on a computer useable or readable storage medium, where the computer program product includes computer useable or readable program codes embodied in the medium to be used by or in connection with an instruction executing system. In the context of the disclosure, the computer useable or readable medium can be any medium which can include, store, communicate, transmit, or transport program to be used by or in connection with an instruction executing system, apparatus or device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An Organic Light-Emitting Diode (OLED) illumination panel, comprising: an base substrate, an organic light-emitting diode on the base substrate, and a drive circuit, wherein the organic light-emitting diode comprises an anode, a cathode, and a light-emitting layer between the anode and the cathode, wherein:
   the anode comprises a plurality of electrode sections distributed in an array, and each of the electrode sections comprises at least one block-shaped electrode;
   electrically-conductive traveling lines corresponding to the electrode sections in a one-to-one manner are on the base substrate, wherein each of the electrically-conductive traveling lines is electrically connected to one of the electrode sections, and in each pair of an electrically-conductive traveling line and an electrode section corresponding to each other, the electrically-conductive traveling line is electrically connected with each block-shaped electrode in the electrode section and not connected with block-shaped electrodes in other electrode sections; and
   the driver circuit is electrically connected with the electrically-conductive traveling lines, and configured to transmit at least one of an illumination driver signal and a touch diver signal to the electrode sections;
   wherein in each pair of an electrode section and an electrically-conductive traveling line corresponding to each other, the electrode section comprises a plurality of block-shaped electrodes distributed in an array, respective block-shaped electrodes are electrically connected with each other through the electrical conductor, and the electrically-conductive traveling line is electrically connected with the electrical conductor; the plurality of block-shaped are spaced with each other;
   wherein in the organic light-emitting diode, the anode is on a side of the cathode facing the base substrate, and the electrically-conductive traveling lines are on a side of the anode facing the base substrate;
   wherein the electrical conductors are at a layer same as a layer at which the electrically-conductive traveling lines are;
   wherein the plurality of electrode sections comprise at least one first electrode section and at least one second electrode section, wherein the electrically-conductive traveling line corresponding to each of the first electrode sections passes through a gap between block-shaped electrodes in the at least one second electrode section:
   the electrical conductor of the second electrode section further comprises bridges for bridging the electrically-conductive traveling line corresponding to the first electrode section.

2. The OLED illumination panel according to claim 1, wherein the bridges are at a layer same as a layer at which the block-shaped electrodes are.

3. The OLED illumination panel according to claim 1, wherein the electrical conductors are at a layer different from a layer at which the electrically-conductive traveling lines are, wherein an insulation layer is between the electrical conductors and the electrically-conductive traveling lines, and the block-shaped electrodes in the electrode section of the anode are electrically connected with corresponding electrical conductors through through-holes.

4. A method for driving an OLED illumination panel by providing the OLED illumination panel according to claim 1 with a driver signal, the method comprising:
   providing at least one of an illumination driver signal and a touch driver signal to the electrode sections under a transmission method, wherein the transmission method comprises: in a touch detection stage, providing a touch scan signal to each of the electrode sections, and in an illumination stage, providing an illumination driver signal to each of the electrode sections; or providing an illumination driver signal to a part of the electrode sections, and providing a touch drive signal to other part of the electrode sections;
   generating, by the electrode sections, a touch action signal upon being provided with a touch driver signal; and
   controlling an illumination attribute of the illumination panel according to generated touch action signal.

5. The driving method according to claim 4, wherein the touch action comprises at least one of clicking and sliding, and the illumination attribute comprises at least one of an on-off state, color temperature, or brightness.

6. An illumination device, comprising a lamp stand, and the illumination panel according to claim 1 installed on the lamp stand.

* * * * *